(12) United States Patent
Young et al.

(10) Patent No.: US 10,317,474 B2
(45) Date of Patent: Jun. 11, 2019

(54) SYSTEMS AND METHODS FOR IDENTIFYING FAULTY BATTERY IN AN ELECTRONIC DEVICE

(71) Applicant: Hand Held Products, Inc., Fort Mill, SC (US)

(72) Inventors: Timothy Young, Clover, SC (US); Timothy Havens, Huntersville, NC (US); Dennis Henry Cudzilo, Camillus, NY (US); John Yeschick, Baldwinsville, NY (US); Sree Harsha Rameswarareddy, Charlotte, NC (US)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 387 days.

(21) Appl. No.: 14/960,552

(22) Filed: Dec. 7, 2015

(65) Prior Publication Data
US 2016/0178707 A1    Jun. 23, 2016

Related U.S. Application Data

(60) Provisional application No. 62/093,806, filed on Dec. 18, 2014.

(51) Int. Cl.
| | | |
|---|---|---|
| *G01R 31/36* | (2019.01) | |
| *G01R 31/371* | (2019.01) | |
| *G01R 31/367* | (2019.01) | |
| *H02J 7/00* | (2006.01) | |
| *G01R 31/3835* | (2019.01) | |

(52) U.S. Cl.
CPC ......... *G01R 31/371* (2019.01); *G01R 31/367* (2019.01); *G01R 31/3835* (2019.01); *H02J 7/00* (2013.01)

(58) Field of Classification Search
USPC .......................................................... 702/63
See application file for complete search history.

(56) References Cited

U.S. PATENT DOCUMENTS

| | | | |
|---|---|---|---|
| 6,832,725 B2 | 12/2004 | Gardiner et al. | |
| 7,128,266 B2 | 10/2006 | Marlton et al. | |
| 7,159,783 B2 | 1/2007 | Walczyk et al. | |

(Continued)

FOREIGN PATENT DOCUMENTS

| | | |
|---|---|---|
| WO | 2013163789 A1 | 11/2013 |
| WO | 2013173985 A1 | 11/2013 |

(Continued)

OTHER PUBLICATIONS

U.S. Appl. No. 13/367,978, filed Feb. 7, 2012, (Feng et al.); now abandoned.

(Continued)

*Primary Examiner* — Paul D Lee
(74) *Attorney, Agent, or Firm* — Additon, Higgins & Pendleton, P.A.

(57) ABSTRACT

An electronic device having a battery may be diagnosed and indicated for repair by extracting a log from the electronic device. The log may include a record of battery events including a battery serial number, a battery status, and a battery voltage. The log may be analyzed for battery charge events recorded in the log to determine if the battery is out of tolerance. If the battery is out of tolerance, the battery may be identified as needing replacement.

20 Claims, 9 Drawing Sheets

(56) References Cited

U.S. PATENT DOCUMENTS

| | | |
|---|---|---|
| 7,413,127 B2 | 8/2008 | Ehrhart et al. |
| 7,726,575 B2 | 6/2010 | Wang et al. |
| 8,294,969 B2 | 10/2012 | Plesko |
| 8,317,105 B2 | 11/2012 | Kotlarsky et al. |
| 8,322,622 B2 | 12/2012 | Suzhou et al. |
| 8,366,005 B2 | 2/2013 | Kotlarsky et al. |
| 8,371,507 B2 | 2/2013 | Haggerty et al. |
| 8,376,233 B2 | 2/2013 | Van Horn et al. |
| 8,381,979 B2 | 2/2013 | Franz |
| 8,390,909 B2 | 3/2013 | Plesko |
| 8,408,464 B2 | 4/2013 | Zhu et al. |
| 8,408,468 B2 | 4/2013 | Horn et al. |
| 8,408,469 B2 | 4/2013 | Good |
| 8,424,768 B2 | 4/2013 | Rueblinger et al. |
| 8,448,863 B2 | 5/2013 | Xian et al. |
| 8,457,013 B2 | 6/2013 | Essinger et al. |
| 8,459,557 B2 | 6/2013 | Havens et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,571,307 B2 | 10/2013 | Li et al. |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 8,740,082 B2 | 6/2014 | Wilz |
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,736,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |
| 8,807,432 B2 | 8/2014 | Van Horn et al. |
| 8,820,630 B2 | 9/2014 | Qu et al. |
| 8,822,848 B2 | 9/2014 | Meagher |
| 8,824,692 B2 | 9/2014 | Sheerin et al. |
| 8,824,696 B2 | 9/2014 | Braho |
| 8,842,849 B2 | 9/2014 | Wahl et al. |
| 8,844,822 B2 | 9/2014 | Kotlarsky et al. |
| 8,844,823 B2 | 9/2014 | Fritz et al. |
| 8,849,019 B2 | 9/2014 | Li et al. |
| D716,285 S | 10/2014 | Chaney et al. |
| 8,851,383 B2 | 10/2014 | Yeakley et al. |
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Bremer et al. |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,903,172 B2 | 12/2014 | Smith |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |
| 8,915,444 B2 | 12/2014 | Havens et al. |
| 8,916,789 B2 | 12/2014 | Woodburn |
| 8,918,250 B2 | 12/2014 | Hollifield |
| 8,918,564 B2 | 12/2014 | Caballero |
| 8,925,818 B2 | 1/2015 | Kosecki et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |

(56) References Cited

U.S. PATENT DOCUMENTS

| | | |
|---|---|---|
| 8,950,678 B2 | 2/2015 | Germaine et al. |
| D723,560 S | 3/2015 | Zhou et al. |
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber et al. |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 9,224,022 B2 | 12/2015 | Ackley et al. |
| 9,224,027 B2 | 12/2015 | Van Horn et al. |
| D747,321 S | 1/2016 | London et al. |
| 9,230,140 B1 | 1/2016 | Ackley |
| 9,443,123 B2 | 1/2016 | Hejl |
| 9,250,712 B1 | 2/2016 | Todeschini |
| 9,258,033 B2 | 2/2016 | Showering |
| 9,262,633 B1 | 2/2016 | Todeschini et al. |
| 9,310,609 B2 | 4/2016 | Rueblinger et al. |
| D757,009 S | 5/2016 | Oberpriller et al. |
| 9,342,724 B2 | 5/2016 | McCloskey et al. |
| 9,375,945 B1 | 6/2016 | Bowles |
| D760,719 S | 7/2016 | Zhou et al. |
| 9,390,596 B1 | 7/2016 | Todeschini |
| D762,604 S | 8/2016 | Fitch et al. |
| D762,647 S | 8/2016 | Fitch et al. |
| 9,412,242 B2 | 8/2016 | Van Horn et al. |
| D766,244 S | 9/2016 | Zhou et al. |
| 9,443,222 B2 | 9/2016 | Singel et al. |
| 9,478,113 B2 | 10/2016 | Xie et al. |
| 2005/0134225 A1* | 6/2005 | Mese .................... H01M 10/42 320/132 |
| 2007/0063048 A1 | 3/2007 | Havens et al. |
| 2009/0134221 A1 | 5/2009 | Zhu et al. |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2011/0169999 A1 | 7/2011 | Grunow et al. |
| 2011/0202554 A1 | 8/2011 | Powilleit et al. |
| 2012/0111946 A1 | 5/2012 | Golant |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2013/0043312 A1 | 2/2013 | Van Horn |
| 2013/0075168 A1 | 3/2013 | Amundsen et al. |
| 2013/0116868 A1* | 5/2013 | Erko ...................... B60W 10/26 701/22 |
| 2013/0175341 A1 | 7/2013 | Kearney et al. |
| 2013/0175343 A1 | 7/2013 | Good |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0285620 A1* | 10/2013 | Yamamoto ............ H02J 7/0029 320/155 |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308625 A1 | 11/2013 | Corcoran |
| 2013/0313324 A1 | 11/2013 | Koziol et al. |
| 2013/0313325 A1 | 11/2013 | Wilz et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0025584 A1 | 1/2014 | Liu et al. |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0098792 A1 | 4/2014 | Wang et al. |
| 2014/0100774 A1 | 4/2014 | Showering |
| 2014/0100813 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Li et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0121438 A1 | 5/2014 | Kearney |

(56) References Cited

U.S. PATENT DOCUMENTS

| | | |
|---|---|---|
| 2014/0121445 A1 | 5/2014 | Ding et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131441 A1 | 5/2014 | Nahill et al. |
| 2014/0131443 A1 | 5/2014 | Smith |
| 2014/0131444 A1 | 5/2014 | Wang |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0191644 A1 | 7/2014 | Chaney |
| 2014/0191913 A1 | 7/2014 | Ge et al. |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0270196 A1 | 9/2014 | Braho et al. |
| 2014/0270229 A1 | 9/2014 | Braho |
| 2014/0278387 A1 | 9/2014 | DiGregorio |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0350716 A1* | 11/2014 | Fly .................... G06F 1/3212 700/215 |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0039309 A1 | 2/2015 | Braho et al. |
| 2015/0040378 A1 | 2/2015 | Saber et al. |
| 2015/0048168 A1 | 2/2015 | Fritz et al. |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071818 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0161429 A1 | 6/2015 | Xian |
| 2015/0169925 A1 | 6/2015 | Chang et al. |
| 2015/0169929 A1 | 6/2015 | Williams et al. |
| 2015/0186703 A1 | 7/2015 | Chen et al. |
| 2015/0188324 A1* | 7/2015 | Nicholson ............ H02J 7/0077 320/107 |
| 2015/0193644 A1 | 7/2015 | Kearney et al. |
| 2015/0193645 A1 | 7/2015 | Colavito et al. |
| 2015/0199957 A1 | 7/2015 | Funyak et al. |
| 2015/0204671 A1 | 7/2015 | Showering |
| 2015/0210199 A1 | 7/2015 | Payne |
| 2015/0220753 A1 | 8/2015 | Zhu et al. |
| 2015/0254485 A1 | 9/2015 | Feng et al. |
| 2015/0327012 A1 | 11/2015 | Bian et al. |
| 2016/0014251 A1 | 1/2016 | Hejl |
| 2016/0040982 A1 | 2/2016 | Li et al. |
| 2016/0042241 A1 | 2/2016 | Todeschini |
| 2016/0057230 A1 | 2/2016 | Todeschini et al. |
| 2016/0109219 A1 | 4/2016 | Ackley et al. |
| 2016/0109220 A1 | 4/2016 | Laffargue |
| 2016/0109224 A1 | 4/2016 | Thuries et al. |
| 2016/0112631 A1 | 4/2016 | Ackley et al. |
| 2016/0112643 A1 | 4/2016 | Laffargue et al. |
| 2016/0124516 A1 | 5/2016 | Schoon et al. |
| 2016/0125217 A1 | 5/2016 | Todeschini |
| 2016/0125342 A1 | 5/2016 | Miller et al. |
| 2016/0133253 A1 | 5/2016 | Braho et al. |
| 2016/0171720 A1 | 6/2016 | Todeschini |
| 2016/0178479 A1 | 6/2016 | Goldsmith |
| 2016/0180678 A1 | 6/2016 | Ackley et al. |
| 2016/0189087 A1 | 6/2016 | Morton et al. |
| 2016/0125873 A1 | 7/2016 | Braho et al. |
| 2016/0227912 A1 | 8/2016 | Oberpriller et al. |
| 2016/0232891 A1 | 8/2016 | Pecorari |
| 2016/0292477 A1 | 10/2016 | Bidwell |
| 2016/0294779 A1 | 10/2016 | Yeakley et al. |
| 2016/0306769 A1 | 10/2016 | Kohtz et al. |

(56) References Cited

U.S. PATENT DOCUMENTS

2016/0314276 A1 10/2016 Sewell et al.
2016/0314294 A1 10/2016 Kubler et al.

FOREIGN PATENT DOCUMENTS

WO 2014019130 A1 2/2014
WO 2014110495 A1 7/2014

OTHER PUBLICATIONS

U.S. Appl. No. 14/277,337 for Multipurpose Optical Reader, filed May 14, 2014 (Jovanovski et al.); 59 pages; now abandoned.
U.S. Appl. No. 14/446,391 for Multifunction Point of Sale Apparatus With Optical Signature Capture filed Jul. 30, 2014 (Good et al.); 37 pages; now abandoned.
U.S. Appl. No. 29/516,892 for Table Computer filed Feb. 6, 2015 (Bidwell et al.); 13 pages.
U.S. Appl. No. 29/523,098 for Handle for a Tablet Computer filed Apr. 7, 2015 (Bidwell et al.); 17 pages.
U.S. Appl. No. 29/528,890 for Mobile Computer Housing filed Jun. 2, 2015 (Fitch et al.); 61 pages.
U.S. Appl. No. 29/526,918 for Charging Base filed May 14, 2015 (Fitch et al.); 10 pages.
U.S. Appl. No. 14/715,916 for Evaluating Image Values filed May 19, 2015 (Ackley); 60 pages.
U.S. Appl. No. 29/525,068 for Tablet Computer With Removable Scanning Device filed Apr. 27, 2015 (Schulte et al.); 19 pages.
U.S. Appl. No. 29/468,118 for an Electronic Device Case, filed Sep. 26, 2013 (Oberpriller et al.); 44 pages.
U.S. Appl. No. 29/530,600 for Cyclone filed Jun. 18, 2015 (Vargo et al); 16 pages.
U.S. Appl. No. 14/707,123 for Application Independent DEX/UCS Interface filed May 8, 2015 (Pape); 47 pages.
U.S. Appl. No. 14/283,282 for Terminal Having Illumination and Focus Control filed May 21, 2014 (Liu et al.); 31 pages; now abandoned.
U.S. Appl. No. 14/705,407 for Method and System to Protect Software-Based Network-Connected Devices From Advanced Persistent Threat filed May 6, 2015 (Hussey et al.); 42 pages.
U.S. Appl. No. 14/704,050 for Intermediate Linear Positioning filed May 5, 2015 (Charpentier et al.); 60 pages.
U.S. Appl. No. 14/705,012 for Hands-Free Human Machine Interface Responsive to a Driver of a Vehicle filed May 6, 2015 (Fitch et al.); 44 pages.
U.S. Appl. No. 14/715,672 for Augumented Reality Enabled Hazard Display filed May 19, 2015 (Venkatesha et al.); 35 pages.
U.S. Appl. No. 14/735,717 for Indicia-Reading Systems Having an Interface With a User's Nervous System filed Jun. 10, 2015 (Todeschini); 39 pages.
U.S. Appl. No. 14/702,110 for System and Method for Regulating Barcode Data Injection Into a Running Application on a Smart Device filed May 1, 2015 (Todeschini et al.); 38 pages.
U.S. Appl. No. 14/747,197 for Optical Pattern Projector filed Jun. 23, 2015 (Thuries et al.); 33 pages.
U.S. Appl. No. 14/702,979 for Tracking Battery Conditions filed May 4, 2015 (Young et al.); 70 pages.
U.S. Appl. No. 29/529,441 for Indicia Reading Device filed Jun. 8, 2015 (Zhou et al.); 14 pages.
U.S. Appl. No. 14/747,490 for Dual-Projector Three-Dimensional Scanner filed Jun. 23, 2015 (Jovanovski et al.); 40 pages.
U.S. Appl. No. 14/740,320 for Tactile Switch For a Mobile Electronic Device filed Jun. 16, 2015 (Bamdringa); 38 pages.
U.S. Appl. No. 14/740,373 for Calibrating a Volume Dimensioner filed Jun. 16, 2015 (Ackley et al.); 63 pages.

\* cited by examiner

BATTERY LOG

0000093184 LINE: 0000364 V 1.06 EVENT IDENTIFIER, DATE, TIME, SERIAL NUMBER, AUTH, BATTERY VOLTAGE (mV)
BATTERY TEMP (0.1 C), REMAIN CAPACITY (mAh), NOM AVAIL CAPACITY (mAh), FULL CAPACITY (mAh), FULL AVAIL
CAPACITY (mAh), STATE OF CHARGE, MAX TEMP (0.1 C), MIN TEMP (0.1 C), CYCLE COUNT

| Event | Date | Time | Serial | Auth | V | Temp | Remain | NomAvail | FullCap | FullAvail | SoC | MaxT | MinT | Cyc |
|---|---|---|---|---|---|---|---|---|---|---|---|---|---|---|
| CHARGE START | 10/29/13 | 8:18:06 AM | PSSA1115003O2 | TRUE | 4118 | 297 | 4543 | 4543 | 4575 | 4575 | 100 | | | |
| CHARGE END | 10/29/13 | 8:18:07 AM | PSSA1115003O2 | TRUE | 4118 | 297 | 4543 | 4543 | 4575 | 4575 | 100 | 297 | 297 | |
| DISCHARGE START | 10/29/13 | 9:09:57 AM | PSSA1115003O2 | TRUE | 4149 | 296 | 4543 | 4543 | 4575 | 4575 | 100 | | | |
| LOW MAIN | 10/29/13 | 9:44:17 AM | PSSA1115003O2 | TRUE | 4106 | 294 | 4445 | 4477 | 4543 | 4575 | 98 | 297 | 293 | |
| DISCHARGE START | 10/29/13 | 9:55:41 AM | PSSA1115003O2 | TRUE | 4126 | 293 | 4444 | 4476 | 4543 | 4575 | 98 | | | |
| DISCHARGE START | 10/29/13 | 10:03:13 AM | PSSA1115003O2 | TRUE | 4084 | 291 | 4427 | 4458 | 4539 | 4570 | 98 | | | |
| DISCHARGE START | 10/29/13 | 10:03:56 AM | PSSA1115003O2 | TRUE | 4069 | 291 | 4422 | 4453 | 4539 | 4570 | 98 | | | |
| DISCHARGE START | 10/29/13 | 10:38:49 AM | PSSA1115003O2 | TRUE | 4052 | 313 | 4302 | 4333 | 4539 | 4570 | 95 | | | |
| DISCHARGE START | 10/29/13 | 1:59:21 PM | PSSA1115003O2 | TRUE | 3908 | 332 | 3620 | 3653 | 4536 | 4568 | 80 | | | |
| LOW MAIN | 10/29/13 | 2:00:05 PM | PSSA1115003O2 | TRUE | 3905 | 333 | 3615 | 3648 | 4536 | 4568 | 80 | 348 | 333 | |
| DISCHARGE START | 10/29/13 | 3:09:03 PM | PSSA1115003O2 | TRUE | 3908 | 348 | 3361 | 3393 | 4536 | 4568 | 75 | | | |
| LOW MAIN | 10/29/13 | 3:12:00 PM | PSSA1115003O2 | TRUE | 3932 | 346 | 3361 | 3393 | 4536 | 4568 | 75 | 346 | 340 | |
| DISCHARGE START | 10/29/13 | 3:47:55 PM | PSSA1115003O2 | TRUE | 3873 | 341 | 3234 | 3268 | 4550 | 4584 | 72 | | | |
| DISCHARGE START | 10/29/13 | 3:48:12 PM | PSSA1115003O2 | TRUE | 3908 | 341 | 3233 | 3267 | 4550 | 4584 | 72 | | | |
| DISCHARGE START | 10/29/13 | 3:49:35 PM | PSSA1115003O2 | TRUE | 3857 | 341 | 3228 | 3262 | 4550 | 4584 | 71 | | | |
| DISCHARGE START | 10/29/13 | 3:50:19 PM | PSSA1115003O2 | TRUE | 3852 | 341 | 3224 | 3258 | 4550 | 4584 | 71 | | | |
| LOW MAIN | 10/29/13 | 6:51:01 PM | PSSA1115003O2 | TRUE | 3777 | 306 | 2531 | 2564 | 4549 | 4582 | 56 | 341 | 306 | |
| CHARGE START | 10/29/13 | 5:38:02 PM | PSSA1115003O2 | TRUE | 3903 | 274 | 2938 | 2965 | 4397 | 4424 | 67 | | | |
| SUSPEND CHARGE | 10/29/13 | 5:38:02 PM | PSSA1115003O2 | TRUE | 3903 | 274 | 2938 | 2965 | 4397 | 4424 | 67 | 274 | 274 | |
| CHARGE START | 10/29/13 | 5:38:10 PM | PSSA1115003O2 | TRUE | 3903 | 274 | 2938 | 2965 | 4397 | 4424 | 67 | | | |
| SUSPEND CHARGE | 10/29/13 | 5:38:14 PM | PSSA1115003O2 | TRUE | 3903 | 274 | 2938 | 2965 | 4397 | 4424 | 67 | 274 | 274 | |
| CHARGE START | 10/29/13 | 5:38:18 PM | PSSA1115003O2 | TRUE | 3903 | 274 | 2938 | 2965 | 4397 | 4424 | 67 | | | |
| SUSPEND CHARGE | 10/29/13 | 5:38:18 PM | PSSA1115003O2 | TRUE | 3903 | 274 | 2938 | 2965 | 4397 | 4424 | 67 | 274 | 274 | |
| DISCHARGE START | 10/29/13 | 7:05:46 PM | PSSA1115003O2 | TRUE | 3825 | 299 | 2530 | 2563 | 4549 | 4582 | 56 | | | |
| DISCHARGE START | 10/29/13 | 7:15:21 PM | PSSA1115003O2 | TRUE | 3778 | 300 | 2502 | 2534 | 4543 | 4575 | 56 | | | |
| LOW MAIN | 10/29/13 | 7:16:05 PM | PSSA1115003O2 | TRUE | 3755 | 300 | 2497 | 2529 | 4543 | 4575 | 55 | | | |
| DISCHARGE START | 10/29/13 | 7:22:05 PM | PSSA1115003O2 | TRUE | 3667 | 308 | 2463 | 2495 | 4543 | 4575 | 55 | 308 | 300 | |
| DISCHARGE END | 10/29/13 | 7:26:54 PM | PSSA1115003O2 | TRUE | 3815 | 313 | 2462 | 2494 | 4543 | 4575 | 55 | 313 | 300 | 216 |

FIG. 2

SYSTEMS AND METHODS FOR IDENTIFYING FAULTY BATTERY IN AN ELECTRONIC DEVICE

CROSS-REFERENCE TO RELATED APPLICATION

The present application claims the benefit of U.S. Provisional Patent Application No. 62/093,806 for a METHOD OF IDENTIFYING A BAD BATTERY IN AN ELECTRONIC DEVICE filed Dec. 18, 2014. The foregoing patent application is hereby incorporated by reference in its entirety.

FIELD

Embodiments of present invention generally relate to the field of electronic device maintenance and, more specifically, to systems and methods for identifying faulty batteries that have intermittent field failures.

BACKGROUND

A battery installed in an electronic device (e.g., a handheld device such as a portable data terminal (PDT), a personal data assistant (PDA), etc.) is a component that can develop internal failures over time from environmental stresses due to a user handling/mishandling the device (e.g., users dropping the device). In one regard, the battery can develop internal failures due to the internal solder joints breaking from the mechanical stresses of being dropped.

Internal battery failures due to broken internal solder joints can, however, be very intermittent. For example, the PDT (or other electronic device) may operate normally most of the time, but a bump or drop can separate the broken solder joint causing a power loss and a resulting reboot of the PDT. The specific cause of this intermittent device failure may be difficult for the user to determine because the electronic device may operate normally most of the time.

Moreover, when the electronic device having intermittent failures (i.e., failures that come and go) is returned for service by a user, it is difficult for a maintenance or repair technician to specifically identify a faulty battery component because the battery may not exhibit the failure at the time of the repair. Moreover, testing the suspect battery in a different board or device could cause a slight variation in the "twist," "tension," or "spring" pressure that is being applied to the battery/board connector interface such that the broken internal battery joint functions normally during battery testing. This can lead to missed repairs and repeat returns of failed devices causing frustration for the device user/customer.

Therefore, a need exists for more effective maintenance systems and methods for electronic devices, including but not limited to maintenance systems and methods that facilitate accurate detection and subsequent replacement of faulty (i.e., defective, bad, flawed, etc.) batteries in an intermittent failure mode.

SUMMARY

Exemplary systems and methods for identifying/repairing a faulty battery in an electronic device are disclosed. In an exemplary embodiment, a log is extracted from the electronic device having a battery. The log has a record of local charge events and can be used to identify a faulty battery. Although charge events are typically referred to herein, the term battery charge event is used in a broad, generic sense and the events may include additional battery status/information not specific to battery charge/discharge status.

An electronic device that may be utilized in connection with the exemplary systems/methods includes a battery and local software or firmware installed onto the device which is capable of creating a local log of battery charge events. The log may extract/include additional information relating to the battery including but not limited to the battery serial number, battery status, and a battery voltage.

For each battery charge event recorded in the log, the battery charge event may be analyzed to determine if the battery is out of tolerance. If the battery is out of tolerance, replacement of the battery may be indicated to the technician, and the technician may then replace the faulty battery.

The exemplary embodiment described herein identifies intermittent bad batteries by capturing specific battery charge events and logging these events. At the time of repair, these event logs are analyzed for specific operating characteristics that identify a defective battery. The results of the analysis may then be reported to the repair technician. In this regard, even if the battery currently appears to be operating appropriately based upon physical testing, the technician is advised that the battery has previously experienced failures (based upon the log report) and could therefore be defective.

The foregoing illustrative summary, as well as other exemplary objectives and/or advantages of the invention, and the manner in which the same are accomplished, are further explained within the following detailed description and its accompanying drawings.

BRIEF DESCRIPTION OF THE DRAWINGS

FIG. 2 is a view of an exemplary embodiment of a log file generated by software embodying the exemplary method to identify a bad battery.

DETAILED DESCRIPTION

Generally, exemplary systems and methods for identifying defective batteries in an electronic device are disclosed. The electronic device includes software capable of creating a log of battery charge events as they occur. The log may include a record of battery charge events with properties including a battery serial number, a battery status, and a battery voltage.

The log may be extracted from the electronic device by a technician (e.g., using a personal computer (PC)) to diagnose the electronic device. The log may then be analyzed based upon the logged charge events to determine whether the battery of out of tolerance. If the battery is out of tolerance, replacement of the battery is indicated to the technician. Further, the software on the electronic device may be upgraded.

Figure 1:
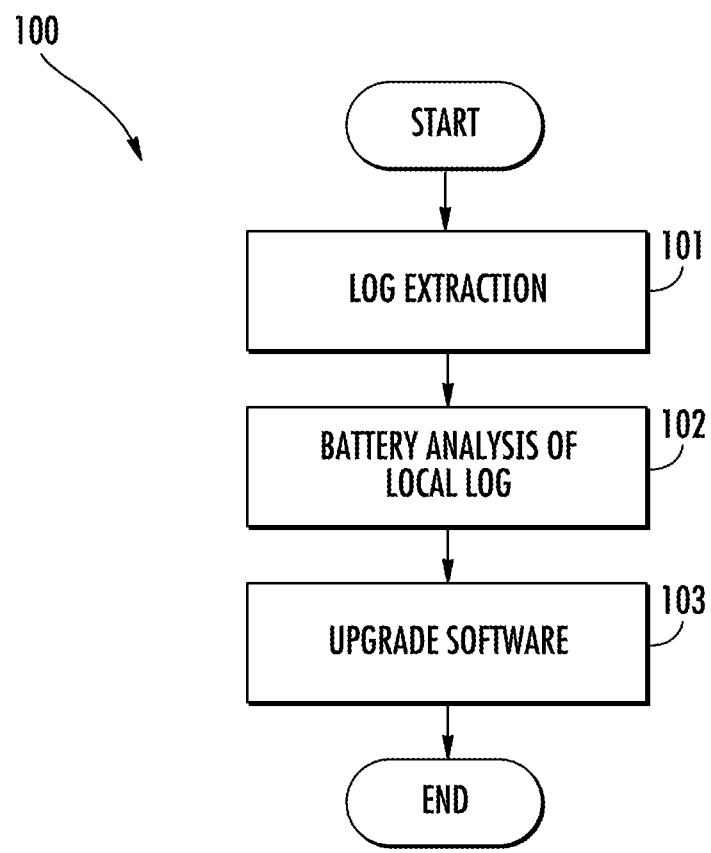
FIG. 1 is a flowchart of an exemplary embodiment of the method to identify a bad battery.

FIG. 1 depicts a flow chart 100 of an exemplary embodiment of a method to identify defective batteries used in an electronic device. The exemplary method as shown includes three steps. First, a log of battery charge events is extracted from the electronic device 101. Second, the battery event log is analyzed 102 to determine if the battery should be indicated to a technician for replacement and/or replaced. Third, and optionally, the software on the electronic device may be upgraded 103.

Although the exemplary system and method embodiments may be described and utilized in connection with electronic devices such as personal data terminals (PDT), personal digital assistants (PDA), and/or personal computers (PCs), and more specifically a HONEYWELL 99EX PDT from Honeywell International, Inc., the methods/systems described herein may be implemented with any electronic device that includes a battery in order to diagnose battery defects. Generally, an exemplary electronic device (e.g., a PDT) may include, but is not limited to, operating components such as a central processing unit, a system bus, a main memory (e.g., RAM, ROM, etc.), a mass storage device (e.g., a hard disk), an operating system (e.g., MICROSOFT WINDOWS) stored on the mass storage device and executed by the central processing unit, and a computer touch screen (or other input/display devices) for receiving input from a user and displaying information.

FIG. 2 is an illustration of an exemplary battery log that the electronic device may be configured to keep relating to battery charge events. Firmware residing on the electronic device (i.e., stored in internal or external device memory) captures the battery status at charge events.

The firmware is designed to specifically monitor/log battery status events which may include: "LOW MAIN," (i.e., the voltage of the battery is low when compared to operating tolerances, which leads to the device shutting down); "CHARGE START," (i.e., battery charging has started, such as when external voltage has been applied to the electronic device); "CHARGE END," (i.e., battery charging has ended, such as when external voltage has been removed from the electronic device, or when the battery is fully charged); "DISCHARGE START," (i.e., discharge of the battery has started, such as when the battery is being used to power the device); "DISCHARGE END," (i.e., discharge of the battery has ended, such as when the device is operating on external power); "SUSPEND CHARGE," (i.e., charging of the battery has been suspended, such as when the battery is defective, the battery is over temperature, the battery charge time has been exceeded, etc.); "AC REMOVAL" (i.e., the external power supply has been removed from the electronic device), "AC PRESENT" (i.e., the external power supply has been applied to the electronic device), "BATT CHANGE" (i.e., the battery has been removed, and a new battery has been installed in electronic device.); "DOOR REMOVAL" (i.e., the battery compartment of the electronic device has been opened); "TIME LOG" (i.e., a battery status/state event has been recorded into the event log); and "BAD AC" (i.e., the external power supply is present, but is not at a level that is sufficient to charge the battery properly.).

More particularly, the system/method of detecting a bad battery is specifically concerned with two conditions, namely, a "LOW MAIN" status event or a "SUSPEND CHARGE" event. All captured events are saved in an event log file, titled as "BATTERY LOG" in the example at FIG. 2, but other names may be utilized for the log.

The log (e.g., the "BATTERY LOG" of FIG. 2) may be formatted as an ASCII text file to conserve storage space. The log size may also be limited to a maximum size of 5000 characters, or some other limited number. Once the log has reached the maximum allowed size, the oldest portion of the log may be overwritten with new entries.

The log may be further structured such that each line in the text file is a separate charge/status event. As shown in FIG. 2, each entry may include various battery statistics, in addition to the status event in order to provide additional diagnostic data to the technician, such as: DATE; TIME; Battery Serial Number; "RUTH" (i.e., whether the battery is an authentic battery, such as an authentic HONEYWELL device battery); Battery Voltage (millivolts (mV)), Battery Temp (0.1 deg. C.), Remain Capacity (milliamp hours (mAh)), "Nom Avail Capacity" (mAh) (i.e., the remaining battery capacity, but not compensated for temperature and battery load); "Full Capacity" (mAh) (i.e., the full battery capacity, but not compensated for temperature and battery load); "State of Charge" (i.e., the battery capacity remaining expressed as a percentage of the full capacity); Max Temp (0.1 deg. C.), Min Temp (0.1 deg. C.), and "Cycle count" (i.e., the number of battery charge and discharge cycles).

The firmware may record the log in a delimited format, such as with tabs or commas, in order to permit simplified parsing of the log. Other delimiters or coding may be used.

The exemplary battery log illustrated in FIG. 2 is illustrated in a comma delimited, ASCII format. The advantage of using an ASCII text file for storage of the log is that it is human readable (i.e., readable by a device technician), but the log may be encoded in other condensed formats, such as when storage space is critical.

Figure 3:
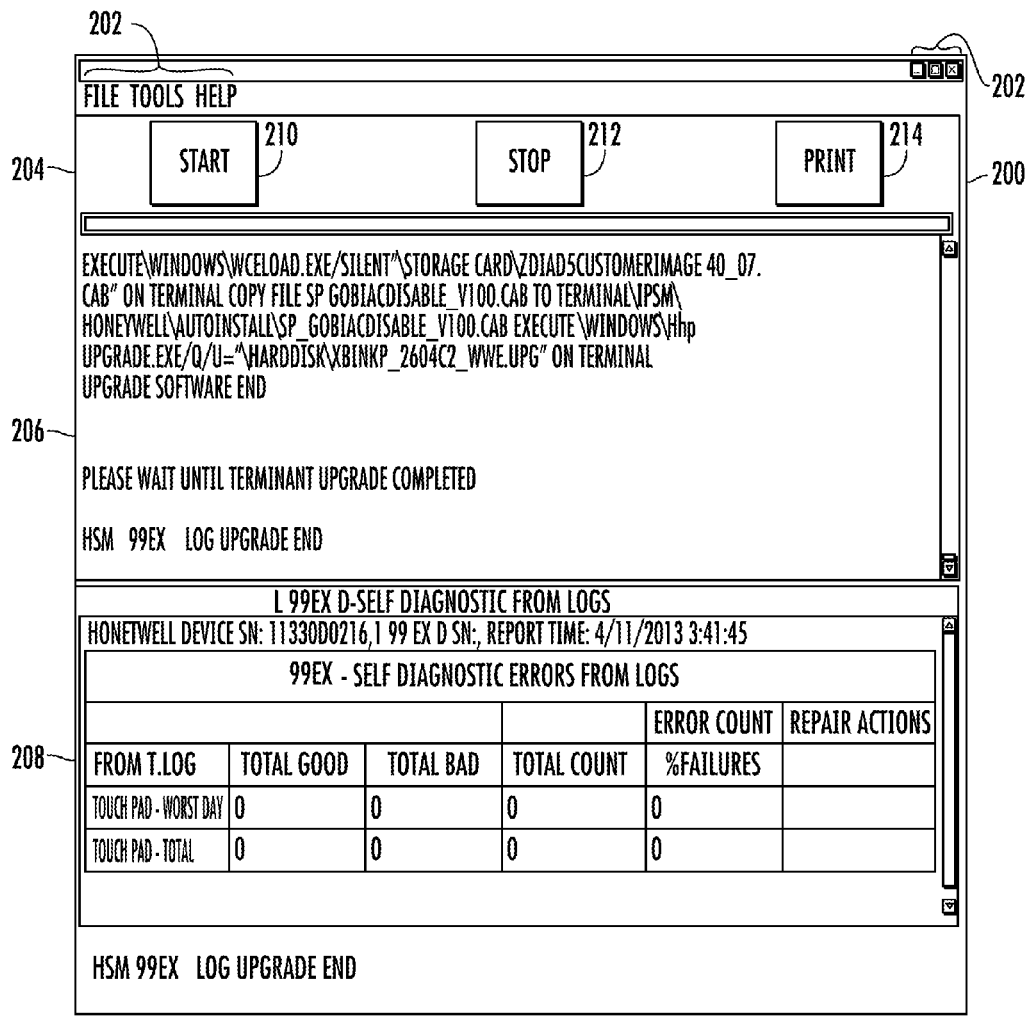
FIG. 3 is a screenshot of an exemplary embodiment of software embodying the exemplary method to identify a bad battery.
Figure 4:
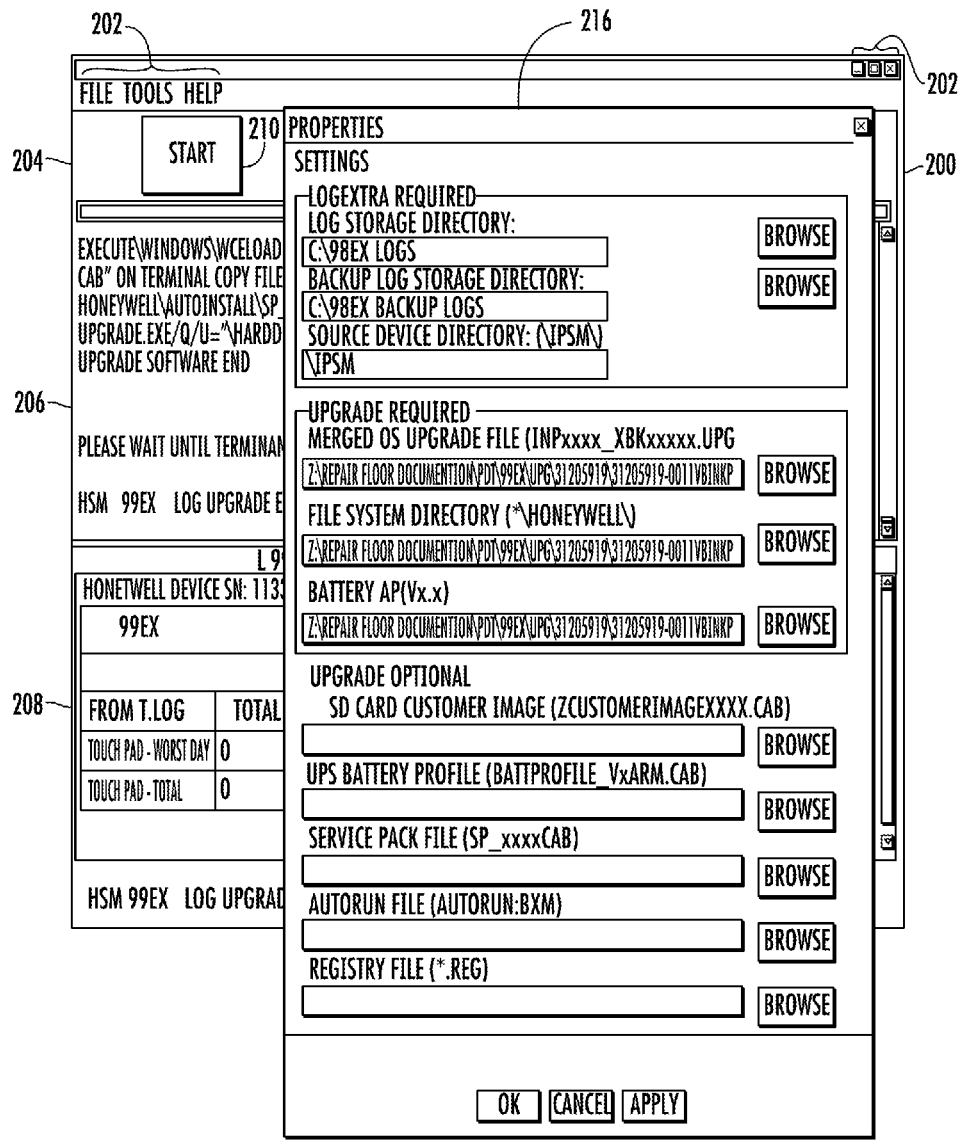
FIG. 4 is a screenshot of an exemplary embodiment of a properties setting screen of software embodying the exemplary method to identify a bad battery.

FIGS. 3 and 4 illustrate screenshots of an exemplary software utility for extracting and analyzing logs, as well as updating firmware on an electronic device. Although the software utility is shown with a graphical user interface ("GUI"), the method may be performed in a command line or other interface as well. The GUI provides an enhanced user interface that is easy to read and run for a technician diagnosing a battery for defects.

With reference to FIGS. 3 and 4, the GUI includes a window 200, including standard operating system controls 202 (e.g., MICROSOFT WINDOWS controls). The exemplary window 200 is divided into three main panes: a tool bar 204, an activity pane 206, and a diagnostic pane 208. The tool bar 204 includes three buttons: start 210, stop 212, and print 214. The start button 210 starts the extraction and analysis of the log and upgrades the firmware, if desired, on the electronic device. The stop button 212 stops and/or aborts the activities commenced or underway. The print button 214 prints the results of the diagnostic pane 208 of the software utility. Optionally, the results of the activity pane 206 may also be included on a print out.

Although a MICROSOFT WINDOWS operating environment is shown, the software utility may be programmed in any desirable language and run on any operating system as desired. It is contemplated that the software utility run on a technician's device, such as a PC, and the electronic device under repair be connected to the technician's device through a wired connection, such as a serial port interface, USB interface, or other connection. Proprietary communications connections may also be used. Although a wired connection is contemplated, the communications may also be wireless and even performed remotely, at least to identify a faulty battery, saving the user/customer time, expense, and loss of use of the electronic device relating to time in transit for devices not needing a battery replacement.

The activity pane 206 lists the actions being taken and the status of those actions as they are performed by the software utility, which is useful for the technician to see that the software utility is performing correctly (e.g., not "hanging up," exiting prematurely, etc.).

The diagnostic pane 208 provides a formatted output of the analysis of the log and identifies if the battery should be replaced by the technician. A completed report is best seen in FIG. 3. The results are reported in a chart including a row for the battery log analysis and a column for the recommended repair action, "RepairActions" (i.e., providing an indication in the column as to whether the battery should be replaced, such as a red bar indicating the battery is bad). In addition to the formatted output of the analysis, the diagnostic pane 208 also includes the device serial number of the electronic device and the date and time the report was created. As shown, the diagnostic tool may also include additional tests, such as testing for whether a touch panel screen of the electronic is defective.

FIG. 4 provides an illustration of a properties window 216 (accessible under the "Tools/Settings" menu), which includes settings for memory storage location, name, and directory path for the log. Further, if an upgrade to the electronic device firmware is needed (e.g., to upgrade device parameters), file names and paths to the firmware upgrade may be provided so that the upgrade of the firmware may be performed by the software utility. As described further below, entries in the fields of the properties pane are used to identify whether an upgrade is needed and where to find those upgrade files.

Figure 5A:
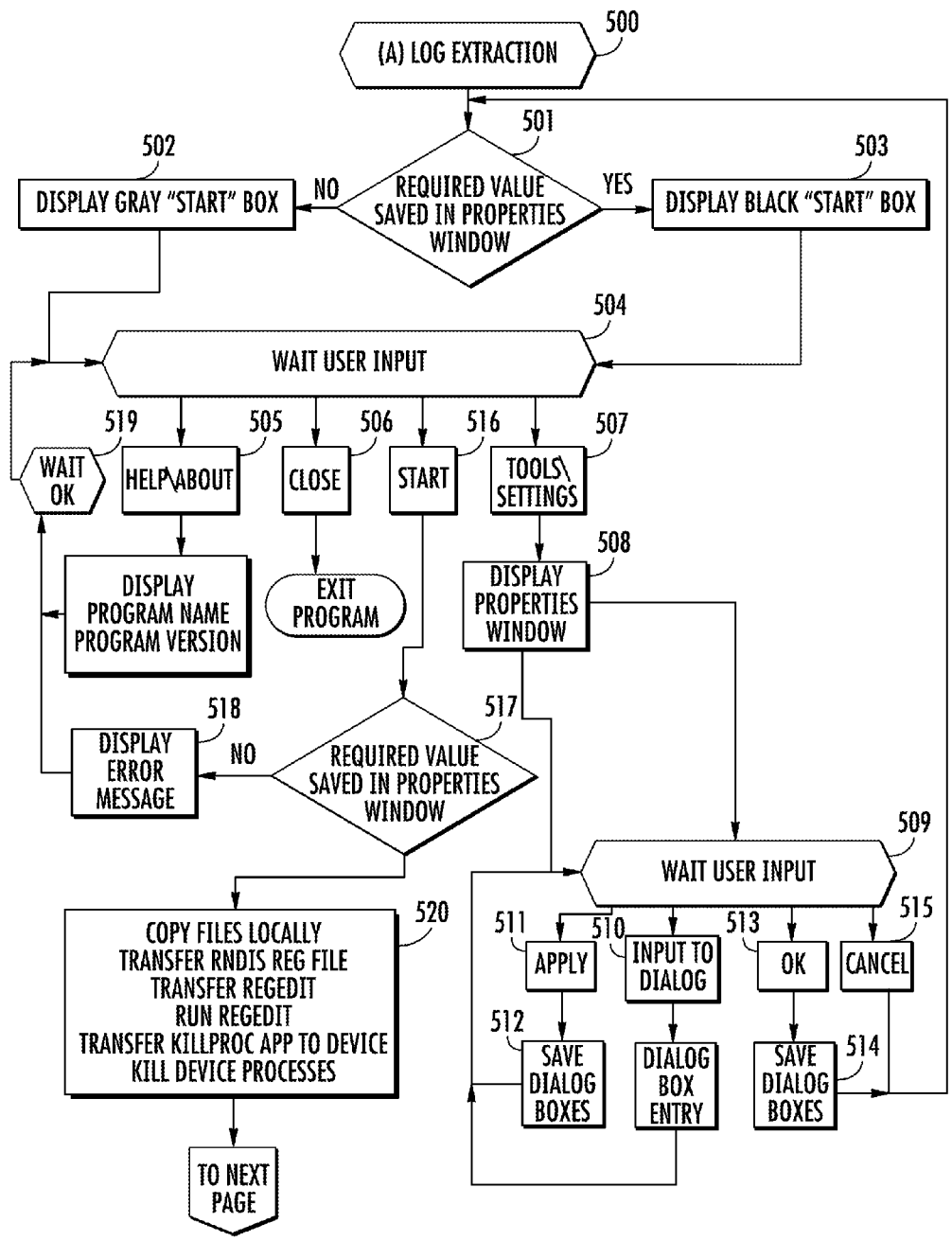
FIG. 5A is a first part of a flowchart illustrating a log extraction step of the exemplary method to identify a bad battery.
Figure 5B:
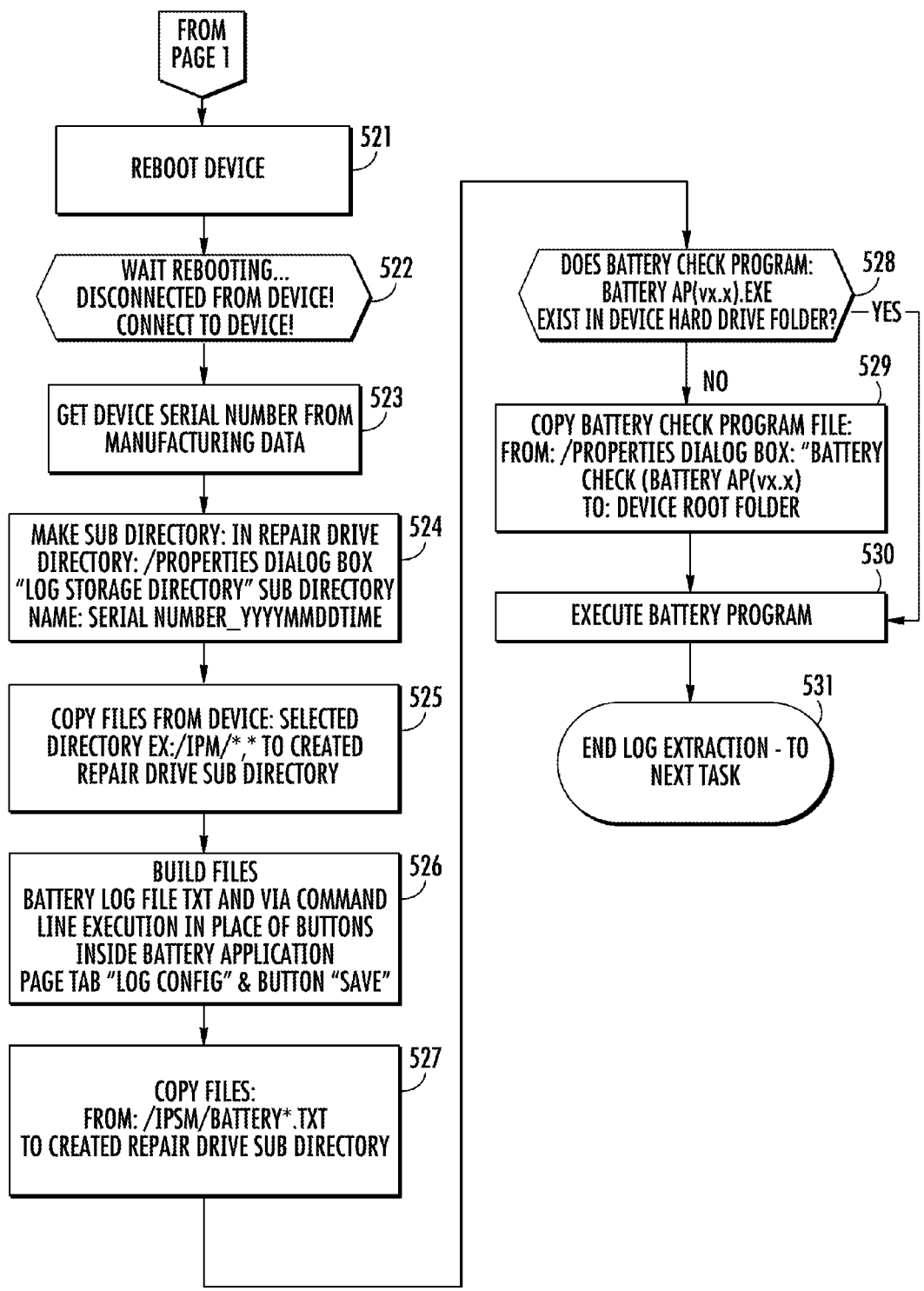
FIG. 5B is a second part of the flowchart of FIG. 5A.

FIGS. 5A and 5B, collectively, provide a flowchart illustrating an exemplary log extraction process (step 500) from an electronic device. A step 501, the software utility ascertains whether the required properties values are set in the preferences window (as best shown at FIG. 4). If not, the software prevents the user from activating the start button by graying it out at step 502. If, however, the required properties are set, the start button is marked black and remains active in step 503. At step 504, the software utility waits for user input.

If the user selects "Help/About" (step 505), the software utility displays the software utility name and version, and thereafter returns to step 504 after a short delay at step 519. At step 506, if the user (e.g., a repair technician) selects "Close," the software utility exits the program.

At step 507, if the user selects "Tools/Settings" the software utility displays the properties windows at step 508 (which is best seen in FIG. 4), and waits for user input at step 509. The user may then: change, delete, or edit the fields of the properties window at step 510 and select "Apply" at step 511 which saves the changed fields of the properties window at step 512, but leaves the properties window open for further review and/or editing; select "OK" at step 513, which saves the changed fields of the properties window at step 514 and returns to step 501; or select "Cancel" at step 515 which closes the properties window without saving the fields and returns to step 501.

If the user presses the start button, illustrated at step 516, the software utility verifies that the required values of the properties window have been set at step 517. If not, the software utility displays an error message at step 518 and returns to step 504 after a short delay at step 519. If the required values are set, the software utility at step 520 prepares the electronic device by copying the settings file locally, transferring changes to the system (such as to the registry) to the electronic device, and terminating running processes on the electronic device.

As shown at FIG. 5B, once the running processes have been terminated, the electronic device is rebooted at step 521. The software utility waits for the electronic device to finish booting at step 522. At step 523, the serial number and manufacturing data are queried from the electronic device. At step 524, the software utility may create directories for the log storage directory and subdirectories according to the settings in the required properties window on the technician's computer. At step 525, the log file is copied from the electronic device.

At steps 526, 527, 528, 529, and 530, the software utility may also rebuild the battery log file and install the battery check program in the proper subdirectory. At step 531, the log extraction is complete.

Figure 6:
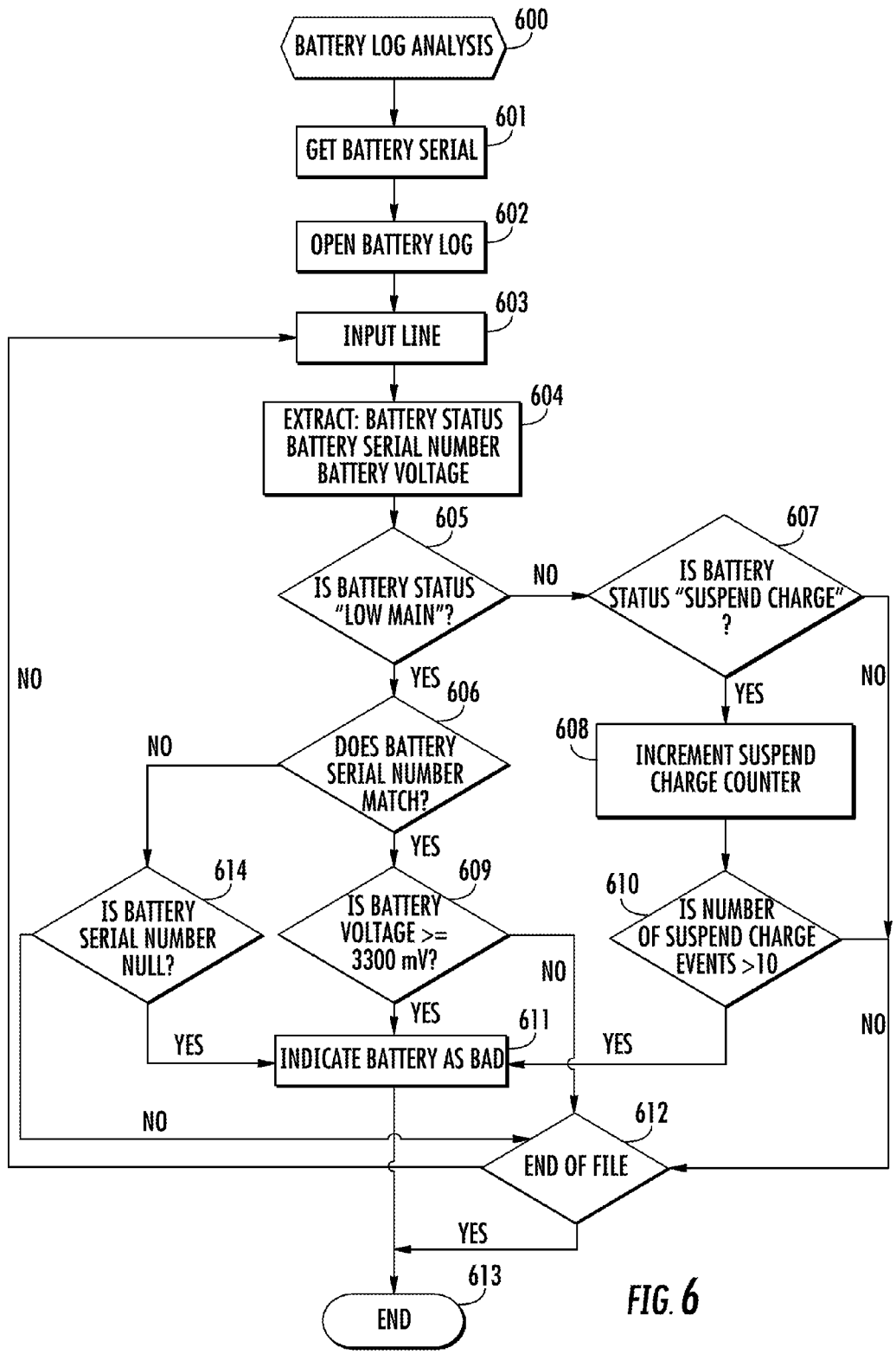
FIG. 6 is a flowchart illustrating an exemplary process of analyzing the log of the battery charge events to identify a bad battery.

FIG. 6 provides a flowchart of the software utility analyzing the battery log file to determine if the battery should be recommended for replacement because it is experiencing intermittent failures (step 600). The software utility obtains the battery serial number at step 601. At step 602, the software utility opens the log file. The software utility then reads a line from the log file at step 603 parsing the log file (i.e., reading each line from the log file to determine if the battery is out of tolerance). Notably, the software utility parses the line to determine the battery status, the battery serial number, and the battery voltage at the time of the battery charge event was recorded (step 604).

At step 605, the software utility determines if the battery status is a "LOW MAIN," for example, that the voltage of the battery was determined to be low when compared to operating tolerances leading to a device shut down. If true, the software utility determines if the battery serial number in the log matches the battery serial number queried directly from the electronic device at step 606. If false, and if the battery serial number is unknown (at step 614), the battery is indicated as bad at step 611, and the parsing stops at step 613. If true (i.e., the serial number matches at step 606), the software utility determines if the battery voltage is greater than or equal to a battery voltage threshold, such as 3300 millivolts (mV) (step 609). If true, the battery is indicated as bad at step 611 and the parsing stops at step 613. If false (i.e., the battery voltage is less than a battery voltage threshold), the software utility checks to see if it has reached the end of the log file at step 612. If false, the software utility returns to step 603 and reads the next line from the log file. If true, the software utility stops parsing at step 613.

At step 607, if the battery status was not "LOW MAIN" at step 605, the software utility determines if the battery status is "SUSPEND CHARGE." If false, the software utility checks to see if it has reached the end of the log file at step 612. If step 607 was true, the software utility increments a "SUSPEND CHARGE" counter at step 608. At step 610, the software utility determines if the "SUSPEND CHARGE" counter has counted more than a specified number of events, such as ten "SUSPEND CHARGE" battery status events. If true, the battery is indicated as bad at step 611 and the parsing stops at step 613. If false, the software utility checks to see if it has reached the end of the log file at step 612, repeating the process until the end of the battery log file.

In sum, as set forth above and illustrated in FIG. 6, if the battery exceeds the battery voltage threshold on a "LOW MAIN" event, the battery serial number is unknown on a "LOW MAIN" event, or the number of "SUSPEND CHARGE" events exceeds ten, the battery can be flagged as bad and the technician can replace the battery.

Figure 7A:
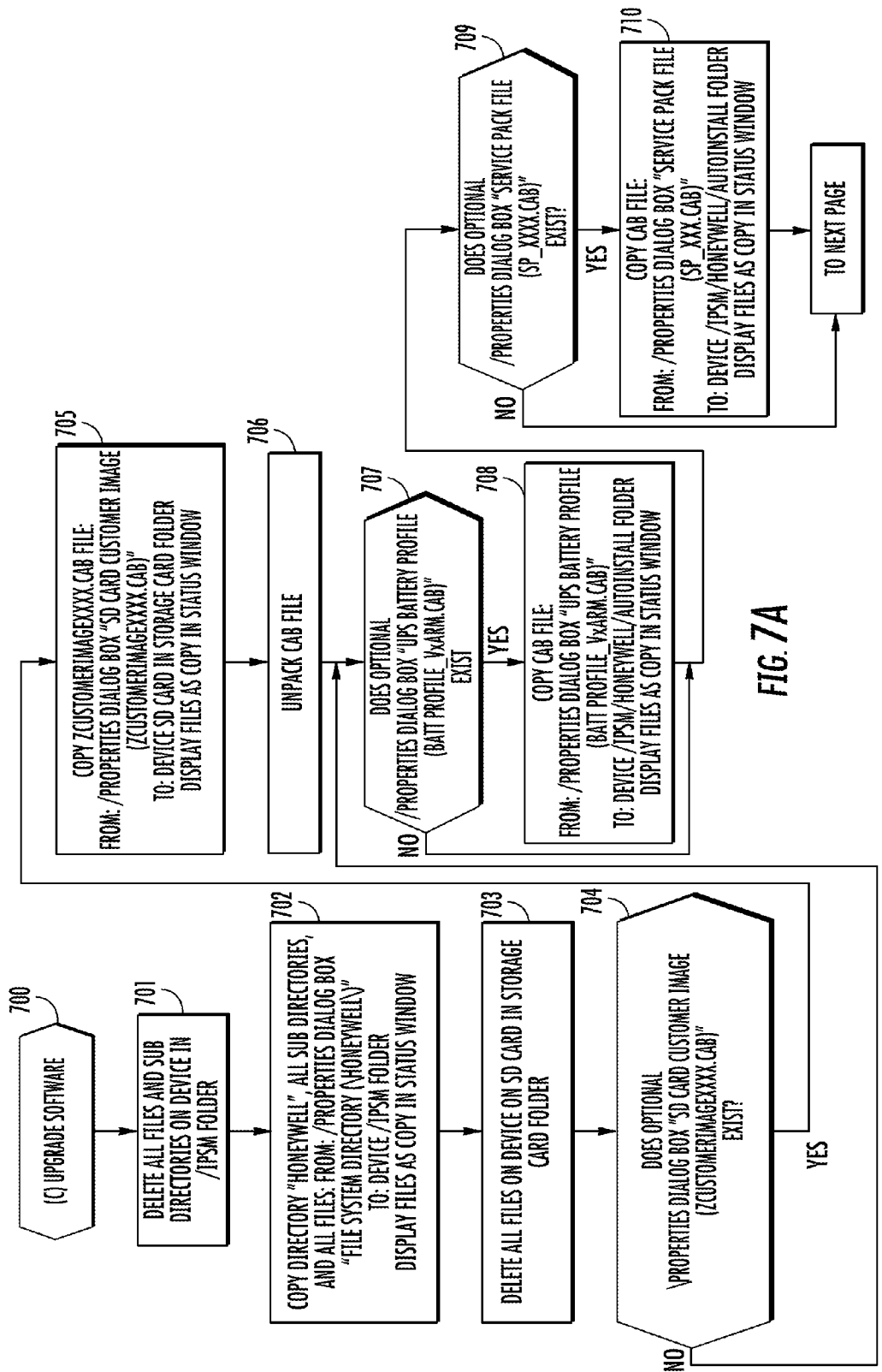
FIG. 7A is a first part of a flow chart illustrating an exemplary software upgrade process of the exemplary method to identify bad batteries.
Figure 7B:
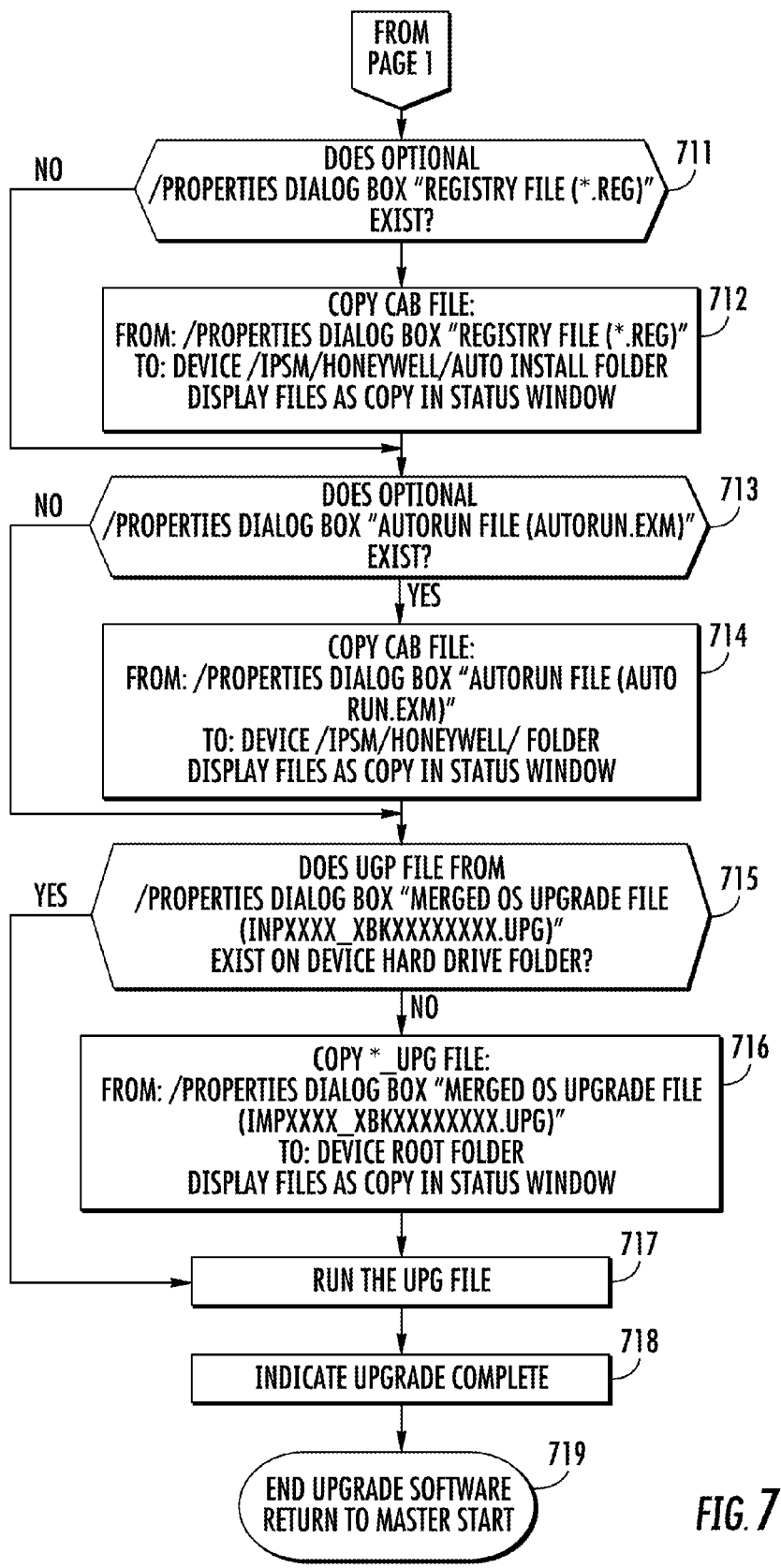
FIG. 7B is a second part of the flowchart of FIG. 7A.

FIGS. 7A and 7B, collectively, provide a flowchart illustrating the process of updating the firmware on an electronic device as shown at step 700. At step 701, the outdated files are deleted from the electronic device. At step 702, the new files are copied to the electronic device from a folder previously designated in the required properties window. The copy operation progress and status will be displayed in the Activity pane 206.

At step 703, if the electronic device further includes removable memory storage (e.g., an SD Card), those files will be deleted as well. At step 704, if the electronic device includes a custom firmware package designated in the optional properties window, the software utility will copy the custom firmware from the folder designated at step 705 and unpack it at step 706.

At step 707, if the electronic device includes a battery profile designated in the optional properties window, the software utility will copy the battery profile from the folder designated to the electronic device at step 708. The copy operation progress and status will be displayed in the Activity pane 206.

At step 709, if an optional service pack update is designated in the optional properties window, the software utility will copy the service pack update from the folder designated at step 710. The copy operation progress and status will be displayed in the Activity pane.

As illustrated in FIG. 7B, at step 711 if a registry file is designated in the optional properties window, the software utility will copy the registry file from the folder designated at step 712. The copy operation progress and status will be displayed in the Activity pane. At step 713, if an Autorun file is designated in the optional properties window, the software utility will copy the Autorun file from the folder designated at step 714. The copy operation progress and status will be displayed in the Activity pane.

At step 715, if a UGP file is designated in the optional properties window (or some other firmware upgrade file type), the software utility will copy the UGP file from the folder designated at step 716. The copy operation progress and status will be displayed in the Activity pane. At step 717, the UGP file will be run. At step 718 the upgrade status will be displayed in the Activity pane as complete. At step 719, the upgrade is complete.

In summary, it can be appreciated from the foregoing description and illustrations that the exemplary systems and methods for identifying bad batteries in an electronic device facilitate electronic device repairs. By analyzing intermittent failures and determining whether the frequency of failures exceeds certain tolerance specifications, a technician can accurately conclude whether to replace the battery, thereby minimizing missed repairs and repeat return of failing devices.

To supplement the present disclosure, this application incorporates entirely by reference the following commonly assigned patents, patent application publications, and patent applications:
U.S. Pat. Nos. 6,832,725; 7,128,266;
7,159,783; 7,413,127;
7,726,575; 8,294,969;
8,317,105; 8,322,622;
8,366,005; 8,371,507;
8,376,233; 8,381,979;
8,390,909; 8,408,464;
8,408,468; 8,408,469;
8,424,768; 8,448,863;
8,457,013; 8,459,557;
8,469,272; 8,474,712;
8,479,992; 8,490,877;
8,517,271; 8,523,076;
8,528,818; 8,544,737;
8,548,242; 8,548,420;
8,550,335; 8,550,354;
8,550,357; 8,556,174;
8,556,176; 8,556,177;
8,559,767; 8,599,957;
8,561,895; 8,561,903;
8,561,905; 8,565,107;
8,571,307; 8,579,200;
8,583,924; 8,584,945;
8,587,595; 8,587,697;
8,588,869; 8,590,789;
8,596,539; 8,596,542;
8,596,543; 8,599,271;
8,599,957; 8,600,158;
8,600,167; 8,602,309;
8,608,053; 8,608,071;
8,611,309; 8,615,487;
8,616,454; 8,621,123;
8,622,303; 8,628,013;
8,628,015; 8,628,016;
8,629,926; 8,630,491;
8,635,309; 8,636,200;
8,636,212; 8,636,215;
8,636,224; 8,638,806;
8,640,958; 8,640,960;
8,643,717; 8,646,692;
8,646,694; 8,657,200;
8,659,397; 8,668,149;
8,678,285; 8,678,286;
8,682,077; 8,687,282;
8,692,927; 8,695,880;
8,698,949; 8,717,494;
8,717,494; 8,720,783;
8,723,804; 8,723,904;
8,727,223; D702,237;
8,740,082; 8,740,085;
8,746,563; 8,750,445;
8,752,766; 8,756,059;
8,757,495; 8,760,563;
8,763,909; 8,777,108;
8,777,109; 8,779,898;
8,781,520; 8,783,573;
8,789,757; 8,789,758;
8,789,759; 8,794,520;
8,794,522; 8,794,525;
8,794,526; 8,798,367;
8,807,431; 8,807,432;
8,820,630; 8,822,848;
8,824,692; 8,824,696;
8,842,849; 8,844,822;
8,844,823; 8,849,019;
8,851,383; 8,854,633;
8,866,963; 8,868,421;
8,868,519; 8,868,802;
8,868,803; 8,870,074;
8,879,639; 8,880,426;
8,881,983; 8,881,987;
8,903,172; 8,908,995;
8,910,870; 8,910,875;
8,914,290; 8,914,788;
8,915,439; 8,915,444;
8,916,789; 8,918,250;

8,918,564; 8,925,818;
8,939,374; 8,942,480;
8,944,313; 8,944,327;
8,944,332; 8,950,678;
8,967,468; 8,971,346;
8,976,030; 8,976,368;
8,978,981; 8,978,983;
8,978,984; 8,985,456;
8,985,457; 8,985,459;
8,985,461; 8,988,578;
8,988,590; 8,991,704;
8,996,194; 8,996,384;
9,002,641; 9,007,368;
9,010,641; 9,015,513;
9,016,576; 9,022,288;
9,030,964; 9,033,240;
9,033,242; 9,036,054;
9,037,344; 9,038,911;
9,038,915; 9,047,098;
9,047,359; 9,047,420;
9,047,525; 9,047,531;
9,053,055; 9,053,378;
9,053,380; 9,058,526;
9,064,165; 9,064,167;
9,064,168; 9,064,254;
9,066,032; 9,070,032;
U.S. Design Pat. No. D716,285;
U.S. Design Pat. No. D723,560;
U.S. Design Pat. No. D730,357;
U.S. Design Pat. No. D730,901;
U.S. Design Pat. No. D730,902;
U.S. Design Pat. No. D733,112;
U.S. Design Pat. No. D734,339;
International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2010/0265880;
U.S. Patent Application Publication No. 2011/0202554;
U.S. Patent Application Publication No. 2012/0111946;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0342717;
U.S. Patent Application Publication No. 2014/0001267;
U.S. Patent Application Publication No. 2014/0008439;
U.S. Patent Application Publication No. 2014/0025584;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. Patent Application Publication No. 2014/0076974;
U.S. Patent Application Publication No. 2014/0078341;
U.S. Patent Application Publication No. 2014/0078345;
U.S. Patent Application Publication No. 2014/0097249;
U.S. Patent Application Publication No. 2014/0098792;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;
U.S. Patent Application Publication No. 2014/0106594;
U.S. Patent Application Publication No. 2014/0106725;
U.S. Patent Application Publication No. 2014/0108010;
U.S. Patent Application Publication No. 2014/0108402;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0166755;
U.S. Patent Application Publication No. 2014/0166759;
U.S. Patent Application Publication No. 2014/0168787;
U.S. Patent Application Publication No. 2014/0175165;
U.S. Patent Application Publication No. 2014/0175172;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;

U.S. Patent Application Publication No. 2014/0214631;
U.S. Patent Application Publication No. 2014/0217166;
U.S. Patent Application Publication No. 2014/0217180;
U.S. Patent Application Publication No. 2014/0231500;
U.S. Patent Application Publication No. 2014/0232930;
U.S. Patent Application Publication No. 2014/0247315;
U.S. Patent Application Publication No. 2014/0263493;
U.S. Patent Application Publication No. 2014/0263645;
U.S. Patent Application Publication No. 2014/0267609;
U.S. Patent Application Publication No. 2014/0270196;
U.S. Patent Application Publication No. 2014/0270229;
U.S. Patent Application Publication No. 2014/0278387;
U.S. Patent Application Publication No. 2014/0278391;
U.S. Patent Application Publication No. 2014/0282210;
U.S. Patent Application Publication No. 2014/0284384;
U.S. Patent Application Publication No. 2014/0288933;
U.S. Patent Application Publication No. 2014/0297058;
U.S. Patent Application Publication No. 2014/0299665;
U.S. Patent Application Publication No. 2014/0312121;
U.S. Patent Application Publication No. 2014/0319220;
U.S. Patent Application Publication No. 2014/0319221;
U.S. Patent Application Publication No. 2014/0326787;
U.S. Patent Application Publication No. 2014/0332590;
U.S. Patent Application Publication No. 2014/0344943;
U.S. Patent Application Publication No. 2014/0346233;
U.S. Patent Application Publication No. 2014/0351317;
U.S. Patent Application Publication No. 2014/0353373;
U.S. Patent Application Publication No. 2014/0361073;
U.S. Patent Application Publication No. 2014/0361082;
U.S. Patent Application Publication No. 2014/0362184;
U.S. Patent Application Publication No. 2014/0363015;
U.S. Patent Application Publication No. 2014/0369511;
U.S. Patent Application Publication No. 2014/0374483;
U.S. Patent Application Publication No. 2014/0374485;
U.S. Patent Application Publication No. 2015/0001301;
U.S. Patent Application Publication No. 2015/0001304;
U.S. Patent Application Publication No. 2015/0003673;
U.S. Patent Application Publication No. 2015/0009338;
U.S. Patent Application Publication No. 2015/0009610;
U.S. Patent Application Publication No. 2015/0014416;
U.S. Patent Application Publication No. 2015/0021397;
U.S. Patent Application Publication No. 2015/0028102;
U.S. Patent Application Publication No. 2015/0028103;
U.S. Patent Application Publication No. 2015/0028104;
U.S. Patent Application Publication No. 2015/0029002;
U.S. Patent Application Publication No. 2015/0032709;
U.S. Patent Application Publication No. 2015/0039309;
U.S. Patent Application Publication No. 2015/0039878;
U.S. Patent Application Publication No. 2015/0040378;
U.S. Patent Application Publication No. 2015/0048168;
U.S. Patent Application Publication No. 2015/0049347;
U.S. Patent Application Publication No. 2015/0051992;
U.S. Patent Application Publication No. 2015/0053766;
U.S. Patent Application Publication No. 2015/0053768;
U.S. Patent Application Publication No. 2015/0053769;
U.S. Patent Application Publication No. 2015/0060544;
U.S. Patent Application Publication No. 2015/0062366;
U.S. Patent Application Publication No. 2015/0063215;
U.S. Patent Application Publication No. 2015/0063676;
U.S. Patent Application Publication No. 2015/0069130;
U.S. Patent Application Publication No. 2015/0071819;
U.S. Patent Application Publication No. 2015/0083800;
U.S. Patent Application Publication No. 2015/0086114;
U.S. Patent Application Publication No. 2015/0088522;
U.S. Patent Application Publication No. 2015/0096872;
U.S. Patent Application Publication No. 2015/0099557;
U.S. Patent Application Publication No. 2015/0100196;
U.S. Patent Application Publication No. 2015/0102109;
U.S. Patent Application Publication No. 2015/0115035;
U.S. Patent Application Publication No. 2015/0127791;
U.S. Patent Application Publication No. 2015/0128116;
U.S. Patent Application Publication No. 2015/0129659;
U.S. Patent Application Publication No. 2015/0133047;
U.S. Patent Application Publication No. 2015/0134470;
U.S. Patent Application Publication No. 2015/0136851;
U.S. Patent Application Publication No. 2015/0136854;
U.S. Patent Application Publication No. 2015/0142492;
U.S. Patent Application Publication No. 2015/0144692;
U.S. Patent Application Publication No. 2015/0144698;
U.S. Patent Application Publication No. 2015/0144701;
U.S. Patent Application Publication No. 2015/0149946;
U.S. Patent Application Publication No. 2015/0161429;
U.S. Patent Application Publication No. 2015/0169925;
U.S. Patent Application Publication No. 2015/0169929;
U.S. Patent Application Publication No. 2015/0178523;
U.S. Patent Application Publication No. 2015/0178534;
U.S. Patent Application Publication No. 2015/0178535;
U.S. Patent Application Publication No. 2015/0178536;
U.S. Patent Application Publication No. 2015/0178537;
U.S. Patent Application Publication No. 2015/0181093;
U.S. Patent Application Publication No. 2015/0181109;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/458,405 for an Electronic Device, filed Jun. 19, 2013 (Fitch et al.);
U.S. patent application Ser. No. 29/459,620 for an Electronic Device Enclosure, filed Jul. 2, 2013 (London et al.);
U.S. patent application Ser. No. 29/468,118 for an Electronic Device Case, filed Sep. 26, 2013 (Oberpriller et al.);
U.S. patent application Ser. No. 14/150,393 for Indicia-reader Having Unitary Construction Scanner, filed Jan. 8, 2014 (Colavito et al.);
U.S. patent application Ser. No. 14/200,405 for Indicia Reader for Size-Limited Applications filed Mar. 7, 2014 (Feng et al.);
U.S. patent application Ser. No. 14/231,898 for Hand-Mounted Indicia-Reading Device with Finger Motion Triggering filed Apr. 1, 2014 (Van Horn et al.);
U.S. patent application Ser. No. 29/486,759 for an Imaging Terminal, filed Apr. 2, 2014 (Oberpriller et al.);
U.S. patent application Ser. No. 14/257,364 for Docking System and Method Using Near Field Communication filed Apr. 21, 2014 (Showering);
U.S. patent application Ser. No. 14/264,173 for Autofocus Lens System for Indicia Readers filed Apr. 29, 2014 (Ackley et al.);
U.S. patent application Ser. No. 14/277,337 for MULTIPURPOSE OPTICAL READER, filed May 14, 2014 (Jovanovski et al.);
U.S. patent application Ser. No. 14/283,282 for TERMINAL HAVING ILLUMINATION AND FOCUS CONTROL filed May 21, 2014 (Liu et al.);
U.S. patent application Ser. No. 14/327,827 for a MOBILE-PHONE ADAPTER FOR ELECTRONIC TRANSACTIONS, filed Jul. 10, 2014 (Hejl);
U.S. patent application Ser. No. 14/334,934 for a SYSTEM AND METHOD FOR INDICIA VERIFICATION, filed Jul. 18, 2014 (Hejl);
U.S. patent application Ser. No. 14/339,708 for LASER SCANNING CODE SYMBOL READING SYSTEM, filed Jul. 24, 2014 (Xian et al.);

U.S. patent application Ser. No. 14/340,627 for an AXIALLY REINFORCED FLEXIBLE SCAN ELEMENT, filed Jul. 25, 2014 (Rueblinger et al.);

U.S. patent application Ser. No. 14/446,391 for MULTIFUNCTION POINT OF SALE APPARATUS WITH OPTICAL SIGNATURE CAPTURE filed Jul. 30, 2014 (Good et al.);

U.S. patent application Ser. No. 14/452,697 for INTERACTIVE INDICIA READER, filed Aug. 6, 2014 (Todeschini);

U.S. patent application Ser. No. 14/453,019 for DIMENSIONING SYSTEM WITH GUIDED ALIGNMENT, filed Aug. 6, 2014 (Li et al.);

U.S. patent application Ser. No. 14/462,801 for MOBILE COMPUTING DEVICE WITH DATA COGNITION SOFTWARE, filed on Aug. 19, 2014 (Todeschini et al.);

U.S. patent application Ser. No. 14/483,056 for VARIABLE DEPTH OF FIELD BARCODE SCANNER filed Sep. 10, 2014 (McCloskey et al.);

U.S. patent application Ser. No. 14/513,808 for IDENTIFYING INVENTORY ITEMS IN A STORAGE FACILITY filed Oct. 14, 2014 (Singel et al.);

U.S. patent application Ser. No. 14/519,195 for HANDHELD DIMENSIONING SYSTEM WITH FEEDBACK filed Oct. 21, 2014 (Laffargue et al.);

U.S. patent application Ser. No. 14/519,179 for DIMENSIONING SYSTEM WITH MULTIPATH INTERFERENCE MITIGATION filed Oct. 21, 2014 (Thuries et al.);

U.S. patent application Ser. No. 14/519,211 for SYSTEM AND METHOD FOR DIMENSIONING filed Oct. 21, 2014 (Ackley et al.);

U.S. patent application Ser. No. 14/519,233 for HANDHELD DIMENSIONER WITH DATA-QUALITY INDICATION filed Oct. 21, 2014 (Laffargue et al.);

U.S. patent application Ser. No. 14/519,249 for HANDHELD DIMENSIONING SYSTEM WITH MEASUREMENT-CONFORMANCE FEEDBACK filed Oct. 21, 2014 (Ackley et al.);

U.S. patent application Ser. No. 14/527,191 for METHOD AND SYSTEM FOR RECOGNIZING SPEECH USING WILDCARDS IN AN EXPECTED RESPONSE filed Oct. 29, 2014 (Braho et al.);

U.S. patent application Ser. No. 14/529,563 for ADAPTABLE INTERFACE FOR A MOBILE COMPUTING DEVICE filed Oct. 31, 2014 (Schoon et al.);

U.S. patent application Ser. No. 14/529,857 for BARCODE READER WITH SECURITY FEATURES filed Oct. 31, 2014 (Todeschini et al.);

U.S. patent application Ser. No. 14/398,542 for PORTABLE ELECTRONIC DEVICES HAVING A SEPARATE LOCATION TRIGGER UNIT FOR USE IN CONTROLLING AN APPLICATION UNIT filed Nov. 3, 2014 (Bian et al.);

U.S. patent application Ser. No. 14/531,154 for DIRECTING AN INSPECTOR THROUGH AN INSPECTION filed Nov. 3, 2014 (Miller et al.);

U.S. patent application Ser. No. 14/533,319 for BARCODE SCANNING SYSTEM USING WEARABLE DEVICE WITH EMBEDDED CAMERA filed Nov. 5, 2014 (Todeschini);

U.S. patent application Ser. No. 14/535,764 for CONCATENATED EXPECTED RESPONSES FOR SPEECH RECOGNITION filed Nov. 7, 2014 (Braho et al.);

U.S. patent application Ser. No. 14/568,305 for AUTO-CONTRAST VIEWFINDER FOR AN INDICIA READER filed Dec. 12, 2014 (Todeschini);

U.S. patent application Ser. No. 14/573,022 for DYNAMIC DIAGNOSTIC INDICATOR GENERATION filed Dec. 17, 2014 (Goldsmith);

U.S. patent application Ser. No. 14/578,627 for SAFETY SYSTEM AND METHOD filed Dec. 22, 2014 (Ackley et al.);

U.S. patent application Ser. No. 14/580,262 for MEDIA GATE FOR THERMAL TRANSFER PRINTERS filed Dec. 23, 2014 (Bowles);

U.S. patent application Ser. No. 14/590,024 for SHELVING AND PACKAGE LOCATING SYSTEMS FOR DELIVERY VEHICLES filed Jan. 6, 2015 (Payne);

U.S. patent application Ser. No. 14/596,757 for SYSTEM AND METHOD FOR DETECTING BARCODE PRINTING ERRORS filed Jan. 14, 2015 (Ackley);

U.S. patent application Ser. No. 14/416,147 for OPTICAL READING APPARATUS HAVING VARIABLE SETTINGS filed Jan. 21, 2015 (Chen et al.);

U.S. patent application Ser. No. 14/614,706 for DEVICE FOR SUPPORTING AN ELECTRONIC TOOL ON A USER'S HAND filed Feb. 5, 2015 (Oberpriller et al.);

U.S. patent application Ser. No. 14/614,796 for CARGO APPORTIONMENT TECHNIQUES filed Feb. 5, 2015 (Morton et al.);

U.S. patent application Ser. No. 29/516,892 for TABLE COMPUTER filed Feb. 6, 2015 (Bidwell et al.);

U.S. patent application Ser. No. 14/619,093 for METHODS FOR TRAINING A SPEECH RECOGNITION SYSTEM filed Feb. 11, 2015 (Pecorari);

U.S. patent application Ser. No. 14/628,708 for DEVICE, SYSTEM, AND METHOD FOR DETERMINING THE STATUS OF CHECKOUT LANES filed Feb. 23, 2015 (Todeschini);

U.S. patent application Ser. No. 14/630,841 for TERMINAL INCLUDING IMAGING ASSEMBLY filed Feb. 25, 2015 (Gomez et al.);

U.S. patent application Ser. No. 14/635,346 for SYSTEM AND METHOD FOR RELIABLE STORE-AND-FORWARD DATA HANDLING BY ENCODED INFORMATION READING TERMINALS filed Mar. 2, 2015 (Sevier);

U.S. patent application Ser. No. 29/519,017 for SCANNER filed Mar. 2, 2015 (Zhou et al.);

U.S. patent application Ser. No. 14/405,278 for DESIGN PATTERN FOR SECURE STORE filed Mar. 9, 2015 (Zhu et al.);

U.S. patent application Ser. No. 14/660,970 for DECODABLE INDICIA READING TERMINAL WITH COMBINED ILLUMINATION filed Mar. 18, 2015 (Kearney et al.);

U.S. patent application Ser. No. 14/661,013 for REPROGRAMMING SYSTEM AND METHOD FOR DEVICES INCLUDING PROGRAMMING SYMBOL filed Mar. 18, 2015 (Soule et al.);

U.S. patent application Ser. No. 14/662,922 for MULTIFUNCTION POINT OF SALE SYSTEM filed Mar. 19, 2015 (Van Horn et al.);

U.S. patent application Ser. No. 14/663,638 for VEHICLE MOUNT COMPUTER WITH CONFIGURABLE IGNITION SWITCH BEHAVIOR filed Mar. 20, 2015 (Davis et al.);

U.S. patent application Ser. No. 14/664,063 for METHOD AND APPLICATION FOR SCANNING A BARCODE WITH A SMART DEVICE WHILE CONTINUOUSLY RUNNING AND DISPLAYING AN APPLICATION ON THE SMART DEVICE DISPLAY filed Mar. 20, 2015 (Todeschini);

U.S. patent application Ser. No. 14/669,280 for TRANSFORMING COMPONENTS OF A WEB PAGE TO VOICE PROMPTS filed Mar. 26, 2015 (Funyak et al.);

U.S. patent application Ser. No. 14/674,329 for AIMER FOR BARCODE SCANNING filed Mar. 31, 2015 (Bidwell);

U.S. patent application Ser. No. 14/676,109 for INDICIA READER filed Apr. 1, 2015 (Huck);

U.S. patent application Ser. No. 14/676,327 for DEVICE MANAGEMENT PROXY FOR SECURE DEVICES filed Apr. 1, 2015 (Yeakley et al.);

U.S. patent application Ser. No. 14/676,898 for NAVIGATION SYSTEM CONFIGURED TO INTEGRATE MOTION SENSING DEVICE INPUTS filed Apr. 2, 2015 (Showering);

U.S. patent application Ser. No. 14/679,275 for DIMENSIONING SYSTEM CALIBRATION SYSTEMS AND METHODS filed Apr. 6, 2015 (Laffargue et al.);

U.S. patent application Ser. No. 29/523,098 for HANDLE FOR A TABLET COMPUTER filed Apr. 7, 2015 (Bidwell et al.);

U.S. patent application Ser. No. 14/682,615 for SYSTEM AND METHOD FOR POWER MANAGEMENT OF MOBILE DEVICES filed Apr. 9, 2015 (Murawski et al.);

U.S. patent application Ser. No. 14/686,822 for MULTIPLE PLATFORM SUPPORT SYSTEM AND METHOD filed Apr. 15, 2015 (Qu et al.);

U.S. patent application Ser. No. 14/687,289 for SYSTEM FOR COMMUNICATION VIA A PERIPHERAL HUB filed Apr. 15, 2015 (Kohtz et al.);

U.S. patent application Ser. No. 29/524,186 for SCANNER filed Apr. 17, 2015 (Zhou et al.);

U.S. patent application Ser. No. 14/695,364 for MEDICATION MANAGEMENT SYSTEM filed Apr. 24, 2015 (Sewell et al.);

U.S. patent application Ser. No. 14/695,923 for SECURE UNATTENDED NETWORK AUTHENTICATION filed Apr. 24, 2015 (Kubler et al.);

U.S. patent application Ser. No. 29/525,068 for TABLET COMPUTER WITH REMOVABLE SCANNING DEVICE filed Apr. 27, 2015 (Schulte et al.);

U.S. patent application Ser. No. 14/699,436 for SYMBOL READING SYSTEM HAVING PREDICTIVE DIAGNOSTICS filed Apr. 29, 2015 (Nahill et al.);

U.S. patent application Ser. No. 14/702,110 for SYSTEM AND METHOD FOR REGULATING BARCODE DATA INJECTION INTO A RUNNING APPLICATION ON A SMART DEVICE filed May 1, 2015 (Todeschini et al.);

U.S. patent application Ser. No. 14/702,979 for TRACKING BATTERY CONDITIONS filed May 4, 2015 (Young et al.);

U.S. patent application Ser. No. 14/704,050 for INTERMEDIATE LINEAR POSITIONING filed May 5, 2015 (Charpentier et al.);

U.S. patent application Ser. No. 14/705,012 for HANDS-FREE HUMAN MACHINE INTERFACE RESPONSIVE TO A DRIVER OF A VEHICLE filed May 6, 2015 (Fitch et al.);

U.S. patent application Ser. No. 14/705,407 for METHOD AND SYSTEM TO PROTECT SOFTWARE-BASED NETWORK-CONNECTED DEVICES FROM ADVANCED PERSISTENT THREAT filed May 6, 2015 (Hussey et al.);

U.S. patent application Ser. No. 14/707,037 for SYSTEM AND METHOD FOR DISPLAY OF INFORMATION USING A VEHICLE-MOUNT COMPUTER filed May 8, 2015 (Chamberlin);

U.S. patent application Ser. No. 14/707,123 for APPLICATION INDEPENDENT DEX/UCS INTERFACE filed May 8, 2015 (Pape);

U.S. patent application Ser. No. 14/707,492 for METHOD AND APPARATUS FOR READING OPTICAL INDICIA USING A PLURALITY OF DATA SOURCES filed May 8, 2015 (Smith et al.);

U.S. patent application Ser. No. 14/710,666 for PRE-PAID USAGE SYSTEM FOR ENCODED INFORMATION READING TERMINALS filed May 13, 2015 (Smith);

U.S. patent application Ser. No. 29/526,918 for CHARGING BASE filed May 14, 2015 (Fitch et al.);

U.S. patent application Ser. No. 14/715,672 for AUGUMENTED REALITY ENABLED HAZARD DISPLAY filed May 19, 2015 (Venkatesha et al.);

U.S. patent application Ser. No. 14/715,916 for EVALUATING IMAGE VALUES filed May 19, 2015 (Ackley);

U.S. patent application Ser. No. 14/722,608 for INTERACTIVE USER INTERFACE FOR CAPTURING A DOCUMENT IN AN IMAGE SIGNAL filed May 27, 2015 (Showering et al.);

U.S. patent application Ser. No. 29/528,165 for IN-COUNTER BARCODE SCANNER filed May 27, 2015 (Oberpriller et al.);

U.S. patent application Ser. No. 14/724,134 for ELECTRONIC DEVICE WITH WIRELESS PATH SELECTION CAPABILITY filed May 28, 2015 (Wang et al.);

U.S. patent application Ser. No. 14/724,849 for METHOD OF PROGRAMMING THE DEFAULT CABLE INTERFACE SOFTWARE IN AN INDICIA READING DEVICE filed May 29, 2015 (Barten);

U.S. patent application Ser. No. 14/724,908 for IMAGING APPARATUS HAVING IMAGING ASSEMBLY filed May 29, 2015 (Barber et al.);

U.S. patent application Ser. No. 14/725,352 for APPARATUS AND METHODS FOR MONITORING ONE OR MORE PORTABLE DATA TERMINALS (Caballero et al.);

U.S. patent application Ser. No. 29/528,590 for ELECTRONIC DEVICE filed May 29, 2015 (Fitch et al.);

U.S. patent application Ser. No. 29/528,890 for MOBILE COMPUTER HOUSING filed Jun. 2, 2015 (Fitch et al.);

U.S. patent application Ser. No. 14/728,397 for DEVICE MANAGEMENT USING VIRTUAL INTERFACES CROSS-REFERENCE TO RELATED APPLICATIONS filed Jun. 2, 2015 (Caballero);

U.S. patent application Ser. No. 14/732,870 for DATA COLLECTION MODULE AND SYSTEM filed Jun. 8, 2015 (Powilleit);

U.S. patent application Ser. No. 29/529,441 for INDICIA READING DEVICE filed Jun. 8, 2015 (Zhou et al.);

U.S. patent application Ser. No. 14/735,717 for INDICIA-READING SYSTEMS HAVING AN INTERFACE WITH A USER'S NERVOUS SYSTEM filed Jun. 10, 2015 (Todeschini);

U.S. patent application Ser. No. 14/738,038 for METHOD OF AND SYSTEM FOR DETECTING OBJECT WEIGHING INTERFERENCES filed Jun. 12, 2015 (Amundsen et al.);

U.S. patent application Ser. No. 14/740,320 for TACTILE SWITCH FOR A MOBILE ELECTRONIC DEVICE filed Jun. 16, 2015 (Bandringa);

U.S. patent application Ser. No. 14/740,373 for CALIBRATING A VOLUME DIMENSIONER filed Jun. 16, 2015 (Ackley et al.);

U.S. patent application Ser. No. 14/742,818 for INDICIA READING SYSTEM EMPLOYING DIGITAL GAIN CONTROL filed Jun. 18, 2015 (Xian et al.);

U.S. patent application Ser. No. 14/743,257 for WIRELESS MESH POINT PORTABLE DATA TERMINAL filed Jun. 18, 2015 (Wang et al.);

U.S. patent application Ser. No. 29/530,600 for CYCLONE filed Jun. 18, 2015 (Vargo et al);

U.S. patent application Ser. No. 14/744,633 for IMAGING APPARATUS COMPRISING IMAGE SENSOR ARRAY HAVING SHARED GLOBAL SHUTTER CIRCUITRY filed Jun. 19, 2015 (Wang);

U.S. patent application Ser. No. 14/744,836 for CLOUD-BASED SYSTEM FOR READING OF DECODABLE INDICIA filed Jun. 19, 2015 (Todeschini et al.);

U.S. patent application Ser. No. 14/745,006 for SELECTIVE OUTPUT OF DECODED MESSAGE DATA filed Jun. 19, 2015 (Todeschini et al.);

U.S. patent application Ser. No. 14/747,197 for OPTICAL PATTERN PROJECTOR filed Jun. 23, 2015 (Thuries et al.);

U.S. patent application Ser. No. 14/747,490 for DUAL-PROJECTOR THREE-DIMENSIONAL SCANNER filed Jun. 23, 2015 (Jovanovski et al.); and U.S. patent application Ser. No. 14/748,446 for CORDLESS INDICIA READER WITH A MULTIFUNCTION COIL FOR WIRELESS CHARGING AND EAS DEACTIVATION, filed Jun. 24, 2015 (Xie et al.).

In the specification and/or figures, typical embodiments and environments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A method for identifying a faulty battery having intermittent field failures, comprising:
   generating, via an electronic device having a battery, a log having a record of captured battery charge events that have occurred during operation of the electronic device over a time period, wherein the charge events are captured by the electronic device as the respective charge events occur;
   extracting, via a computer, the log having the record of captured battery charge events to identify intermittent battery failures, wherein the record includes, for each charge event that is captured, a battery serial number, a battery status, and a battery voltage;
   obtaining, via the computer, a battery serial number of the battery currently installed on the electronic device;
   for each battery charge event recorded in the log, determining, via the computer, if the battery charge event indicates the battery is out of tolerance, wherein the step of determining if the battery charge event indicates the battery is out of tolerance comprises determining if a battery serial number of a battery charge event matches the battery serial number of the battery currently installed; and
   providing, via the computer, an indication to a technician whether the battery currently installed should be replaced if the battery is determined to be out of tolerance.

2. The method of claim 1, wherein the step of determining if the battery charge event indicates the battery is out of tolerance further comprises:
   if the battery serial number of the battery charge event matches the battery serial number of the battery currently installed, further determining if the battery charge event indicates the battery is out of tolerance.

3. The method of claim 2, wherein the step of determining if the battery charge event indicates the battery is out of tolerance comprises determining if a battery charge event includes an unknown battery serial number.

4. The method of claim 2, wherein the step of determining if the battery charge event indicates the battery is out of tolerance comprises determining if a battery charge event has a battery status of LOW MAIN and a battery voltage that exceeds a battery voltage threshold.

5. The method of claim 4, wherein the battery voltage threshold is greater than or equal to 3300 millivolts.

6. The method of claim 2, wherein the step of determining if the battery charge event indicates the battery is out of tolerance comprises determining if a total number of SUSPEND CHARGE events recorded in the log exceeds a threshold count.

7. The method of claim 6, wherein the threshold count is ten.

8. The method of claim 1, wherein the step of determining if the battery charge event indicates the battery is out of tolerance comprises determining if a battery charge event includes an unknown battery serial number.

9. The method of claim 1, wherein the step of determining if the battery charge event indicates the battery is out of tolerance comprises determining if a battery charge event has a battery status of LOW MAIN and a battery voltage that exceeds a battery voltage threshold.

10. The method of claim 9, wherein the battery voltage threshold is greater than or equal to 3300 millivolts.

11. The method of claim 1, wherein the step of determining if the battery charge event indicates the battery is out of tolerance comprises determining if a total number of SUSPEND CHARGE events recorded in the log exceeds a threshold count.

12. The method of claim 11, wherein the threshold count is ten.

13. A method of identifying a bad battery in an electronic device having intermittent field failures, comprising the steps of:
   providing a computer having a software application on the computer;
   providing an electronic device having a battery installed therein, the electronic device comprising firmware capable of capturing battery charge events as the charge events occur over a time period of operation of the electronic device and that are used to identify intermittent battery failures;
   saving, via the firmware, the charge events in an event log, wherein the log includes, for each charge event that is captured, a battery serial number, a battery status, and a battery voltage;
   using the computer and the software application for:
      extracting the event log from the electronic device;
      obtaining a battery serial number of the battery currently installed on the electronic device;

for each battery charge event recorded in the log, determining if the battery charge event indicates the battery is out of tolerance, wherein the step of determining if the battery charge event indicates the battery is out of tolerance comprises determining if a battery serial number of a battery charge event matches the battery serial number of the battery currently installed; and providing, via the computer, an indication to a technician as to whether the battery currently installed should be replaced if the battery is determined to be out of tolerance.

14. The method of claim 13, wherein the step of determining if the battery charge event indicates the battery is out of tolerance further comprises:

if the battery serial number of the battery charge event matches the battery serial number of the battery currently installed, further determining if the battery charge event indicates the battery is out of tolerance.

15. The method of claim 14, wherein the step of determining if the battery charge event indicates the battery is out of tolerance comprises determining if a battery charge event has a battery status of LOW MAIN and a battery voltage that exceeds a battery voltage threshold.

16. The method of claim 15, wherein the battery voltage threshold is greater than or equal to 3300 millivolts.

17. The method of claim 14, wherein the step of determining if the battery charge event indicates the battery is out of tolerance comprises determining if a total number of SUSPEND CHARGE events recorded in the log exceeds a threshold count.

18. The method of claim 17, where in the threshold count is ten.

19. The method of claim 13, further comprising replacing the battery if the battery is determined to be out of tolerance.

20. A system for diagnosing a faulty battery in an electronic device having intermittent field failures, comprising:
an electronic device having a battery installed therein, the electronic device comprising firmware; and
a computer in communication with the electronic device, the computer including a software utility;
wherein the firmware is configured to:
(i) capture battery charge events as the charge events occur over a time period of operation of the electronic device;
(ii) save the charge events in an event log, wherein the log includes, for each charge event that is captured, a battery serial number, a battery status, and a battery voltage;
wherein the software utility is configured to:
(i) extract the log from the electronic device;
(ii) obtain a battery serial number of the battery currently installed on the electronic device;
(iii) analyze battery charge events recorded in the log to determine if a battery charge event indicates the battery is out of tolerance;
(iv) determine if a battery serial number of a battery charge event indicating the battery is out of tolerance matches the battery serial number of the battery currently installed; and
(v) provide a notification that the battery should be replaced if (i) the battery charge event indicates the battery is out of tolerance and (ii) the battery serial number of the battery charge event indicating the battery is out of tolerance matches the battery serial number of the battery currently installed.

* * * * *